US008229713B2

(12) United States Patent
Hamann et al.

(10) Patent No.: US 8,229,713 B2
(45) Date of Patent: Jul. 24, 2012

(54) METHODS AND TECHNIQUES FOR CREATING AND VISUALIZING THERMAL ZONES

(75) Inventors: Hendrik F. Hamann, Yorktown Heights, NY (US); Vanessa Lopez-Marrero, Yorktown Heights, NY (US); Andrew Stepanchuk, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 401 days.

(21) Appl. No.: 12/540,034

(22) Filed: Aug. 12, 2009

(65) Prior Publication Data

US 2011/0040529 A1   Feb. 17, 2011

(51) Int. Cl.
*G06F 17/50* (2006.01)
(52) U.S. Cl. .............. 703/1; 703/6; 703/7; 700/276; 700/300
(58) Field of Classification Search ............ 703/2, 6, 703/1, 7; 700/276, 300; 705/8; 715/771; 356/28; 702/132; 165/247, 41; 361/696, 361/700; 169/54, 62; 422/24; 60/398; 600/458
See application file for complete search history.

(56) References Cited

U.S. PATENT DOCUMENTS

| | | | |
|---|---|---|---|
| 4,895,442 A * | 1/1990 | Boutier et al. ............ 356/28 |
| 7,024,342 B1 * | 4/2006 | Waite et al. ................ 703/6 |
| 7,366,632 B2 | 4/2008 | Hamann et al. |
| 2002/0144473 A1 | 10/2002 | Satomi et al. |
| 2002/0148222 A1 * | 10/2002 | Zaslavsky et al. ........ 60/398 |
| 2003/0019606 A1 * | 1/2003 | Stauder et al. ............ 165/41 |
| 2003/0147770 A1 * | 8/2003 | Brown et al. ............. 422/24 |
| 2007/0062685 A1 * | 3/2007 | Patel et al. ............... 165/247 |
| 2007/0119603 A1 * | 5/2007 | Haaland et al. ............ 169/54 |
| 2008/0015440 A1 * | 1/2008 | Shandas et al. ........... 600/458 |
| 2008/0040067 A1 * | 2/2008 | Bashor et al. ............. 702/132 |
| 2008/0115950 A1 * | 5/2008 | Haaland et al. ............ 169/62 |
| 2008/0155441 A1 * | 6/2008 | Long et al. ................ 715/771 |
| 2008/0158815 A1 * | 7/2008 | Campbell et al. ......... 361/696 |
| 2008/0174954 A1 | 7/2008 | VanGilder et al. |
| 2008/0282948 A1 * | 11/2008 | Quenders et al. ......... 110/348 |

(Continued)

OTHER PUBLICATIONS

Hamann et al., "Uncovering Energy-Efficiency Opportunities in Data Centers," IBM Journal of Research and Development, vol. 53, No. 3 (2009).
L.D. Landau et al., "Fluid Mechanics," Pergamon Press (1959).
T.J.R. Hughes, "The Finite Element Method: Linear Static and Dynamic Finite Element Analysis," Chapter 1, Dover Publications (2000) (Originally published by Prentice-Hall, 1987).

(Continued)

*Primary Examiner* — Kandasamy Thangavelu
(74) *Attorney, Agent, or Firm* — Vazken Alexanian; Michael J. Chang, LLC

(57) ABSTRACT

Techniques for using air flow analysis to model thermal zones are provided. In one aspect, a method for modeling thermal zones in a space, e.g., in a data center, includes the following steps. A graphical representation of the space is provided. At least one domain is defined in the space for modeling. A mesh is created in the domain by sub-dividing the domain into a set of discrete sub-domains that interconnect a plurality of nodes. Air flow sources and sinks are identified in the domain. Air flow measurements are obtained from one or more of the air flow sources and sinks. An air flow velocity vector at a center of each sub-domain is determined using the air flow measurements obtained from the air flow sources and sinks. Each velocity vector is traced to one of the air flow sources, wherein a combination of the traces to a given one of the air flow sources represents a thermal zone in the space.

18 Claims, 10 Drawing Sheets

U.S. PATENT DOCUMENTS

| | | | | |
|---|---|---|---|---|
| 2008/0288193 | A1 | 11/2008 | Claassen et al. | |
| 2009/0138313 | A1* | 5/2009 | Morgan et al. | 705/8 |
| 2009/0326879 | A1* | 12/2009 | Hamann et al. | 703/2 |
| 2009/0326884 | A1* | 12/2009 | Amemiya et al. | 703/6 |
| 2010/0076607 | A1* | 3/2010 | Ahmed et al. | 700/276 |
| 2010/0082309 | A1* | 4/2010 | Dawson et al. | 703/6 |
| 2010/0305911 | A1* | 12/2010 | Samiyilbas et al. | 703/2 |
| 2010/0312415 | A1* | 12/2010 | Loucks | 700/300 |
| 2010/0328890 | A1* | 12/2010 | Campbell et al. | 361/700 |
| 2010/0328891 | A1* | 12/2010 | Campbell et al. | 361/700 |
| 2011/0040532 | A1* | 2/2011 | Hamann et al. | 703/2 |

OTHER PUBLICATIONS

J. Alberty et al., "Remarks Around 50 Lines of Matlab: Short Finite Element Implementation," Numerical Algorithms 20, pp. 117-137 (1999).

H.F. Hamann, et al., "Methods and Techniques for Measuring and Improving Data Center Best Practices" IEEE Proceedings of the ITherm 2008 Conference, Orlando, Florida, pp. 1146-1152 (May 2008).

* cited by examiner

100

A MESH CONSISTING OF A SET OF NINE NODES AND EIGHT ELEMENTS

● : INDICATES A NODE

| ELEMENTS | CORRESPONDING NODES |
|---|---|
| E1 | 1, 2, 4 |
| E2 | 4, 2, 5 |
| E3 | 2, 3, 5 |
| E4 | 3, 6, 5 |
| E5 | 4, 5, 7 |
| E6 | 5, 8, 7 |
| E7 | 5, 6, 8 |
| E8 | 6, 9, 8 |

500

SOURCES (HERE ACU)

SINKS (HERE PERFORATED TILES) / NODE / NODES ARE CONNECTED TO TRIANGLES

500

ACU (BUT TURNED OFF)

PERFORATED TILES / AIR VELOCITY VECTORS / ACU

500

800

800

800

1100

METHODS AND TECHNIQUES FOR CREATING AND VISUALIZING THERMAL ZONES

REFERENCE TO APPENDIX DATA

This application includes a computer program listing appendix in electronic format. The computer program listing appendix is provided as a file entitled ComputerProgramListingAppendix.txt, created on Feb. 15, 2012, which is 27,599 bytes in size. The information in the electronic format of the computer program listing appendix is incorporated by reference, in its entirety, herein.

FIELD OF THE INVENTION

The present invention relates to air flow analysis, and more particularly, to techniques for using air flow distributions to model thermal zones in a space, such as in a data center.

BACKGROUND OF THE INVENTION

Energy consumption has become a critical issue for large scale computing facilities (or data centers), triggered by the rise in energy costs, supply and demand of energy and the proliferation of power hungry information and communication technology (ICT) equipment. Data centers consume approximately two percent (%) of all electricity globally or 183 billion kilowatt (KW) hours of power; this power consumption is growing at a rate of 12% each year. A significant fraction of the power consumption, i.e., up to 50%, is directed to cooling the heat generating equipment. Consequently, the improvement of data center energy and cooling efficiency is very important. Although best practices have been widely publicized, data center operators are struggling to provision the right amount of cooling. In particular, it is challenging to take different heat densities within a data center into account (i.e., different areas within the data center may require very different amounts of cooling).

Therefore techniques directed to highlighting heat densities within a data center and thereby increasing cooling efficiency would be desirable.

SUMMARY OF THE INVENTION

The present invention provides techniques for using air flow distributions to model thermal zones. In one aspect of the invention, a method for modeling thermal zones in a space, e.g., in a data center, is provided. The method includes the following steps. A graphical representation of the space is provided. At least one domain is defined in the space for modeling. A mesh is created in the domain by sub-dividing the domain into a set of discrete sub-domains that interconnect a plurality of nodes. Air flow sources and sinks are identified in the domain. Air flow measurements are obtained from one or more of the air flow sources and sinks. An air flow velocity vector at a center of each sub-domain is determined using the air flow measurements obtained from the air flow sources and sinks. Each velocity vector is traced to one of the air flow sources, wherein a combination of the traces to a given one of the air flow sources represents a thermal zone in the space.

A more complete understanding of the present invention, as well as further features and advantages of the present invention, will be obtained by reference to the following detailed description and drawings.

DETAILED DESCRIPTION OF PREFERRED EMBODIMENTS

Presented herein are techniques for dynamically creating and visualizing thermal zones, which enables better provisioning and a more efficient usage of cooling for data centers. It is notable that while the instant techniques are described in the context of a cooling system of a data center, the concepts presented herein are generally applicable to cooling and/or heating systems in general.

Figure 1:
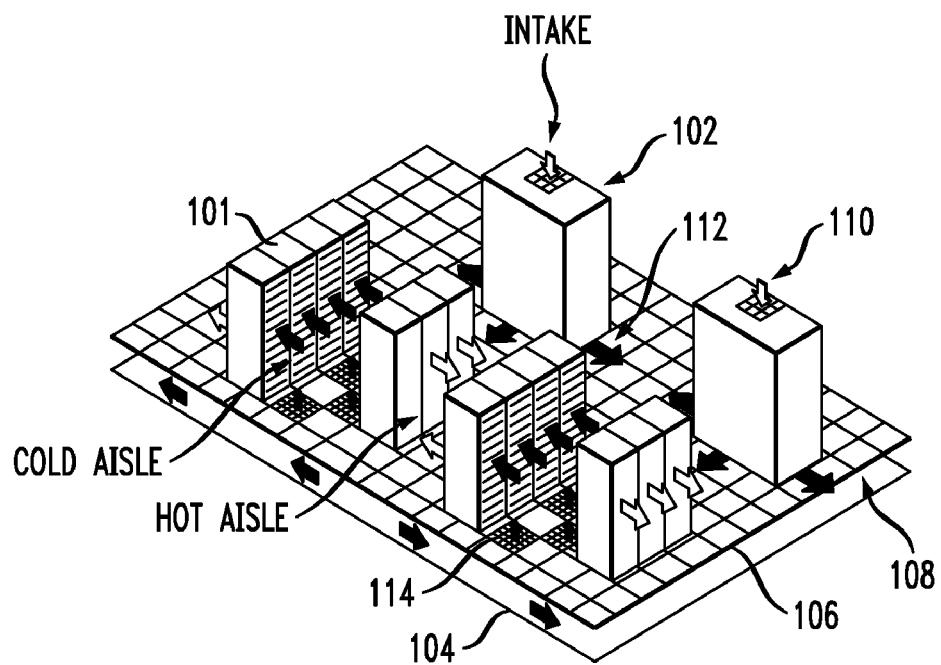
FIG. 1 is a diagram illustrating an exemplary data center according to an embodiment of the present invention.

FIG. 1 is a diagram illustrating exemplary data center 100. Data center 100 has server racks 101 and a raised-floor cooling system with air conditioning units (ACUs) 102 (which may also be referred to as computer room air conditioners (CRACs)) that take hot air in (typically from above through one or more air returns in the ACUs) and exhaust cooled air into a sub-floor plenum below. Hot air flow through data center 100 is indicated by light arrows 110 and cooled air flow through data center 100 is indicated by dark arrows 112. In the following description, the data center above the sub-floor plenum may also be referred to simply as the raised floor, and the sub-floor plenum may be referred to simply as the plenum. Thus, by way of example only, as shown in FIG. 1, the ACUs intake warm air from the raised floor and expel cooled air into the plenum (see below).

In FIG. 1, server racks 101 use front-to-back cooling and are located on raised-floor 106 with sub-floor 104 beneath. Namely, according to this scheme, cooled air is drawn in through a front (inlet) of each rack and warm air is exhausted out from a rear (outlet) of each rack. The cooled air drawn into the front of the rack is supplied to air inlets of each information technology (IT) equipment component (servers for example) therein. Space between raised floor 106 and sub-floor 104 defines the sub-floor plenum 108. The sub-floor plenum 108 serves as a conduit to transport, e.g., cooled air from the ACUs 102 to the racks. As shown in FIG. 1, raised-floor 106 consists of a plurality of floor tiles, some of which are perforated. In a properly-organized data center (such as data center 100), racks 101 are arranged in a hot aisle—cold aisle configuration, i.e., having air inlets and exhaust outlets in alternating directions. Namely, cooled air is blown through the perforated floor tiles 114 (also referred to as vents) in raised-floor 106, from the sub-floor plenum 108 into the cold aisles. The cooled air is then drawn into racks 101, via the air inlets, on an air inlet side of the racks and dumped, via the exhaust outlets, on an exhaust outlet side of the racks and into the hot aisles.

The ACUs typically receive chilled water from a refrigeration chiller plant (not shown). Each ACU typically comprises a blower motor to circulate air through the ACU and to blow cooled air, e.g., into the sub-floor plenum. As such, in most data centers, the ACUs are simple heat exchangers mainly consuming power needed to blow the cooled air into the sub-floor plenum. Typically, one or more power distribution units (PDUs) (not shown) are present that distribute power to the server racks 101.

It is important to optimize the efficiency of the ACUs. See, for example, Hamann et al., "Uncovering Energy-Efficiency Opportunities in Data Centers," IBM Journal of Research and Development, vol. 53, no. 3 (2009) (hereinafter "Hamann"), the contents of which are incorporated by reference herein. To this end, it is useful to consider the utilization levels of the ACUs (i.e., utilization (UT)=heat removed/nominal heat load removal capacity) or coefficient of performance (COP) (COP=heat removed/power consumption for ACU fans). It has been shown that utilization levels of ACUs in some data centers are as low as 10% (COP~1.8). However, utilization levels could potentially be in the range of from about 80% to about 100% (even with some redundancy) with corresponding COPs of from about 14 to about 18, respectively, if efficiency optimization practices are employed. Most data centers require some redundancy. For example, in a data center with eight ACUs, redundancy allows for one ACU to fail (for example due to mechanical failure). So, in essence the target utilization level cannot be 7/8 (87.5%) because then there would not be N+1 redundancy (N=8).

One of the inhibitors to optimizing ACU usage is a lack of visibility, i.e., an inability to discern to which physical areas or zones in a data center different ACUs are supplying cooled air. Thermal zones are physical areas (two-dimensional (2D)) or volumes (three-dimensional (3D)) within the data center. Each ACU supplies air to a specific thermal zone within the data center, which may also be referred to herein as a "supply zone" and typically applies to the plenum. Each ACU also gets return air from a specific thermal zone in the data center, which may also be referred to herein as a "return zone" and typically applies to the raised floor.

It is not unusual for a data center to have more than 50 ACUs somewhat randomly distributed across the data center space. The thermal zone resulting from each ACU (supply and/or return zone) is not only governed by the air flow produced by each ACU but also by the placement of vents or perforated tiles throughout the data center (because the vents or perforated tiles direct, at least in part, to where in the data center the air from the ACUs is directed, see below). It is not unusual for data centers to have more than 1,000 vents or perforated tiles. Because these thermal zones are based on the actual air flow contribution of each ACU, a corresponding efficiency or coefficient of performance (COP) can be assigned to each thermal zone of each respective ACU. The air flow distribution throughout a data center is governed by many aspects. The present techniques use the simplest form of air flow distribution in a data center by applying the zone concept to the plenum. ACUs discharge air into the plenum using fans and as a result the plenum is pressurized. The placement of the vents or perforated tiles governs where the air escapes the plenum on the raised floor. That vent/perforated tile placement determines the zones (i.e., which area is supplied by which ACU).

Figure 2:
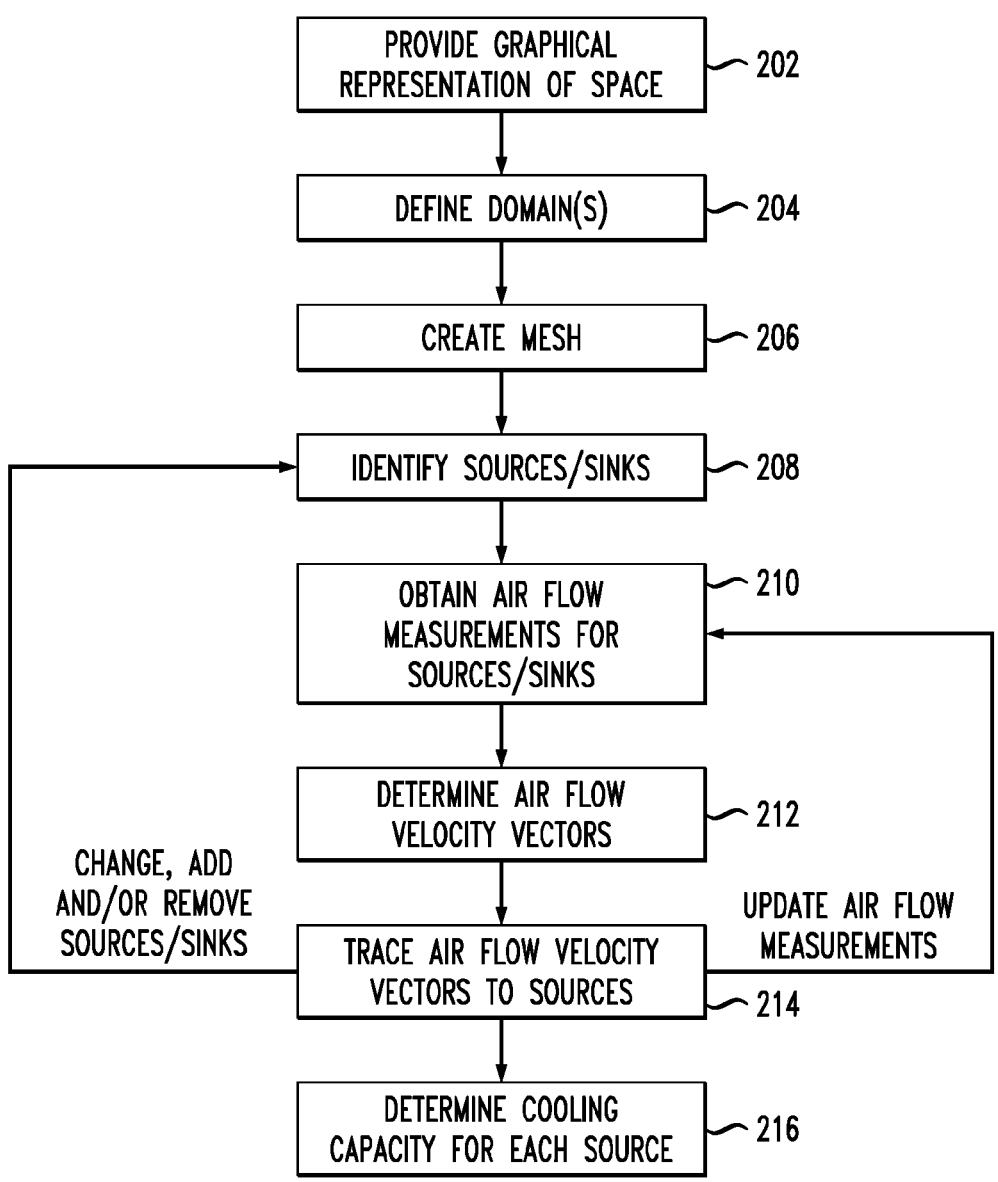
FIG. 2 is a diagram illustrating an exemplary methodology for modeling thermal zones according to an embodiment of the present invention.

Disclosed herein are techniques for modeling, i.e., creating and visualizing, these thermal zones. As will be described in further detail below, a velocity field is used to define, i.e., create, the thermal zones (that is, the zones are not defined beforehand, and thus must be created). Creating/defining the zones is an important aspect of the present techniques as it provides one way to determine how efficiently each ACU is being used (via the COP measure). FIG. 2 is a diagram illustrating exemplary methodology 200 for modeling thermal zones in a space, e.g., within a room, such as data center 100. In step 202, a graphical representation of the space is provided. For example, a two-dimensional graphical representation of a data center is provided in FIG. 4, described below. In the case of a data center, the graphical representation can include, for example, the layout of the server racks, the vents or perforated tiles and the ACUs. The graphical representation can be created using a software application, which "draws" the assets such as the server racks. An example for this is a mobile management technology software application (which is what was used to create the graphical representation shown in FIG. 4).

In step 204, at least one domain for thermal zone modeling is defined in the space. Each domain can be a two-dimensional or three-dimensional domain. As will be described below, in one exemplary embodiment wherein a data center is being modeled, the domain is defined by the dimensions of the sub-floor plenum. As will also be described below, more than one domain can be defined for a given space. Depending on the particular application, such as the physical layout of the space to which the present techniques are applied, the domain(s) may comprise the entire space, or a portion(s) thereof.

In step 206, since finite elements are being employed to model the space, a finite element mesh is created in each of the domains by sub-dividing each domain into a set of discrete sub-domains that interconnect a plurality of nodes. As will be described in detail below, the sub-domains (also referred to herein as "elements") can be triangles (in the case of two-dimensional domains) or tetrahedra (in the case of three-dimensional domains). The use of triangles and tetrahedra are standard choices in the finite element method. The nodes correspond to x and y coordinates (in the case of two-dimensional domains) or to x, y and z coordinates (in the case of three-dimensional domains).

In step 208, air flow sources (where the airflow enters the domain) and air flow sinks (where the air flow exits the domain) are identified in the domain. By way of reference to a data center, when the domain includes the sub-floor plenum the perforated tiles can be considered air flow sinks (because it is at the perforated tiles where the cooled air supplied by the ACUs exits the sub-floor plenum and enters the raised floor) and the ACUs can be considered air flow sources (because the airflow originates/enters the sub-floor plenum from the ACUs). On the other hand, when the domain includes the raised floor the perforated tiles can be considered air flow sources (because it is at the perforated tiles where the cooled air from the plenum enters the raised floor) and the ACUs can be considered sinks (because the warm air is cycled back into the ACUs and thus exits the raised-floor at the ACUs).

In step 210, air flow measurements are obtained from one or more of the air flow sources and sinks. According to an exemplary embodiment, these air flow measurements are obtained using mobile measurement technology (MMT). MMT is described for example in U.S. Pat. No. 7,366,632, issued to Hamann et al., entitled "Method and Apparatus for Three-Dimensional Measurements" (hereinafter "U.S. Pat. No. 7,366,632") the contents of which are incorporated by reference herein. MMT V1.0 is a technology for optimizing data center infrastructures for improved energy and space efficiency which involves a combination of advanced metrology techniques for rapid measuring/surveying data centers (see, for example, U.S. Pat. No. 7,366,632) and metrics-based assessments and data-based best practices implementation for optimizing a data center within a given thermal envelope for optimum space and most-efficient energy utilization (see, for example, U.S. application Ser. No. 11/750,325, filed by Claassen et al., entitled "Techniques for Analyzing Data Center Energy Utilization Practices,", the contents of which are incorporated by reference herein).

In step 212, the air flow measurements obtained from the air flow sources and sinks are used to determine an air flow velocity vector at a center of each sub-domain (element). An exemplary process for determining these air flow velocity vectors using potential flow theory is described in detail below.

In step 214, each velocity vector is traced to one of the air flow sources. By way of reference to a data center model wherein the domain comprises the sub-floor plenum, each velocity vector can be traced to a particular ACU. An exemplary process for tracing the velocity vectors is described in detail below. A combination of the traces to a given one of the air flow sources (e.g., ACU) represents a thermal zone in the space. Exemplary thermal zones are shown, for example, in FIG. 10, described below.

As shown in FIG. 2, steps 208-214 of methodology 200 can be repeated in response to changes in the air flow at one or more of the sources/sinks, one or more new sources/sinks being added to the domain and/or one or more of the sources/sinks being removed from the domain. For example, by way of reference to a data center, the air flow at one or more of the vents or perforated tiles may be increased or decreased and/or one or more of the vents or perforated tiles may be relocated or removed. As will be described in detail below, advantageously, as long as the domain/finite element mesh does not change, then these elements can be recycled in subsequent iterations of the methodology saving on processing time.

Each time the above-described steps are repeated, updated air flow measurements from the air flow sources and sinks can be acquired (if available) therefore making the instant techniques sensitive to changing conditions within the space. By way of example only, steps 210-214 can be repeated periodically (for example at a pre-determined time interval) to acquire updated air flow measurement data. The pre-determined time interval can be set, for example, based on a frequency at which updated measurement data is available and/or a frequency with which changes occur in the space.

In step 216, a cooling capacity is determined for each air flow source. For example, with reference to data center modeling, the cooling capacity of each vent or perforated tile can be determined. An exemplary process for determining cooling capacity is described in detail below.

As highlighted above, in one exemplary embodiment, potential flow theory is employed assuming constant (temperature independent) air density, free slipping over boundaries and that viscous forces can be neglected. For a general description of potential flow theory see, for example, L. D. Landau et al., "Fluid Mechanics," Pergamon Press (1959), the contents of which are incorporated by reference herein.

As the air velocity $v=(v_x, v_y, v_z)$ is assumed to be irrotational, that is, curl $v=0$, the velocity can be taken to be the gradient of a scalar function $\phi$. This function $\phi$ is called the "velocity (or air flow) potential" and it satisfies the Poisson equation. In other words, the (air) velocity field corresponds to a solution of:

$$\left(\frac{\partial^2 \phi}{\partial x^2}\right) + \left(\frac{\partial^2 \phi}{\partial y^2}\right) + \left(\frac{\partial^2 \phi}{\partial z^2}\right) = f \quad (1)$$

$$v_x = \frac{\partial \phi}{\partial x} \quad v_y = \frac{\partial \phi}{\partial y} \quad v_z = \frac{\partial \phi}{\partial z} \quad (2)$$

with appropriate boundary conditions. Here, f represents flow sources or sinks and $v_x$, $v_y$ and $v_z$ are the velocity components in the x, y and z directions, respectively. It is notable that other more comprehensive partial differential equations (PDEs) can be used in accordance with the present techniques, which may include turbulence models and dissipation.

In order to provide boundary conditions for the above problem one could, for example, model vents or perforated tiles (or the output of ACUs) as "sources"

$$\left(\frac{\partial \phi}{\partial z} = -(\text{measured}) \text{ output velocity from a perforated tile}\right),$$

the returns to the ACUs as "sinks" ($\phi=0$), while the racks are sinks $$\left(\frac{\partial \phi}{\partial x} = (\text{measured}) \text{ inlet rack flow}\right)$$

and sources $$\left(\frac{\partial \phi}{\partial x} = -(\text{measured}) \text{ outlet rack flow}\right)$$

at the same time. As described above, the sources and sinks can vary depending on the domain (e.g., when the domain includes the sub-floor plenum the perforated tiles and ACUs can be considered sinks and sources, respectively; on the other hand when the domain includes the raised floor the perforated tiles and ACUs can be considered sources and sinks, respectively). Another alternative is to model the sources and sinks via a non-zero right-hand side f in Equation 1. If the sources or sinks are located on boundaries of the solution domain of the PDE, the former approach is appropriate (as it corresponds to the specification of Neumann boundary conditions). For sources or sinks that are located inside the solution domain (that is, not on boundaries), modeling via a non-zero right-hand side f in Equation 1 would be more suitable.

A finite element solver is implemented herein to calculate the air flow potential. For a standard reference on the finite element method, see T. J. R. Hughes, "The Finite Element Method Linear Static and Dynamic Finite Element Analysis," Chapter 1, Dover Publications (2000) (Originally published by Prentice-Hall, 1987), the contents of which are incorporated by reference herein. One exemplary implementation of the present techniques was done in the C programming language, following some analogous finite element implementations in Matlab by J. Alberty et al., "Remarks Around 50 Lines of Matlab: Short Finite Element Implementation," Numerical Algorithms 20, pp. 117-137 (1999) (hereinafter "Alberty"), the contents of which are incorporated by reference herein.

Figure 3:
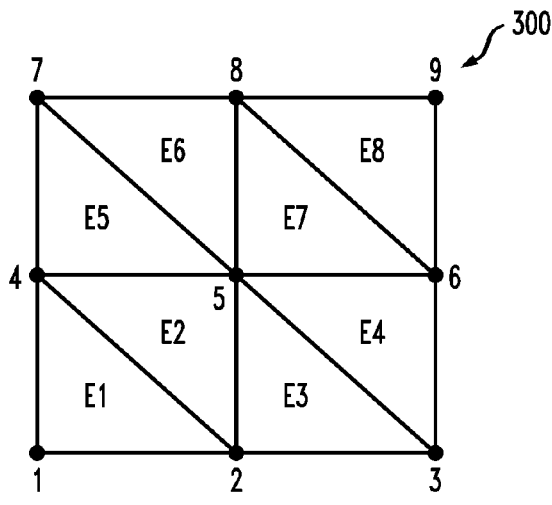
FIG. 3 is a diagram illustrating an exemplary finite element mesh according to an embodiment of the present invention.

The solver requires specification of a mesh, which consists of a set of nodes within a specified domain, as well as triangles (for two-dimensional domains) or tetrahedra (for three-dimensional domains) connecting these nodes. As highlighted above, the triangles (or tetrahedra) are also referred to herein as elements of the mesh. The nodes correspond to (x,y) coordinates in a two-dimensional domain (or (x,y,z) coordinates in a three-dimensional domain). An example of a finite element mesh is shown illustrated in FIG. 3. Namely, FIG. 3 is a diagram illustrating an exemplary finite element mesh 300 that includes a set of nine nodes and eight elements in a two-dimensional domain. A key to each of the eight elements E and the corresponding nodes is provided to the right of the mesh.

An approximate solution, $$\phi \approx \sum_{i=1}^{N} \hat{\phi}_i \Psi_i \quad (3)$$

is sought to Equation 1 as a linear combination of N basis functions $\Psi_i$, i=1, ..., N. Letting $\vec{x}_j$ denote the j-th node in the mesh, the basis functions are chosen so that $\Psi_i(\vec{x}_j)$=1 if i=j and $\Psi_i(\vec{x}_j)$=0 otherwise. This is typical of finite element approximations and has the advantage that the coefficient $\hat{\phi}_i$ in the linear combination of Equation 3 also corresponds to the approximation of the solution at the i-th node. As in Alberty, piecewise linear basis functions can be used to approximate the solution of Equation 1. Again, this is a standard choice in finite element approximations. Upon application of a Galerkin finite element discretization to Equation 1 with suitable boundary conditions one obtains a system of linear equations, $$A\hat{\phi}=b. \quad (4)$$

The process for applying a Galerkin finite element discretization to Equation 1 to result in the system of Equations 4 would be apparent to one of skill in the art, and thus is not described further herein. The solution $\hat{\phi}=(\hat{\phi}_1, \ldots, \hat{\phi}_N)$ of Equation 4 gives an approximate solution to the air flow potential $\phi$ at the nodes of the finite element mesh. Since the interest is in obtaining the gradient of the potential, as it defines the velocity field in Equations 2, once the linear system of Equations 4 is solved, a numerical approximation to the gradient of $\phi$ can be obtained from the linear combination of Equation 3 and the solution $\hat{\phi}$ of the system of Equations 4. This provides the air flow field, as defined by Equations 2. However, due to the choice of basis functions, it is not meaningful to obtain an approximation to the gradient at the mesh nodes. Instead, an approximation is valid at points inside each element. The center of each element can be chosen as a convenient and standard coordinate point, i.e., at which to approximate the velocity field. Thermal zones can then be defined from trajectories of the air flow, as described below.

Figure 4:
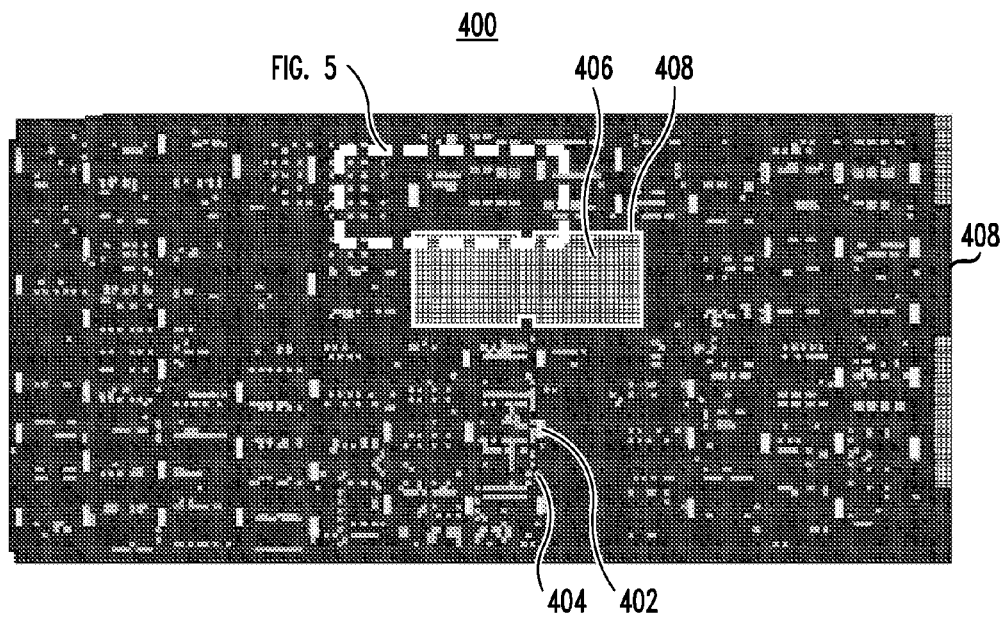
FIG. 4 is a diagram illustrating a graphical representation of a data center according to an embodiment of the present invention.

A two-dimensional implementation of the above techniques to calculate the air flow potential for the sub-floor plenum area of a large (e.g., greater than 50,000 square feet) data center will now be described. In the following, the focus is on "plenum" thermal zones but the same principles can be applied to "above plenum" or the total raised floor data center. FIG. 4 is a diagram illustrating a graphical representation 400 of a data center, which includes a plurality of ACUs 402 and perforated tiles 404. Such a graphical representation can be created, for example, using MMT Client, see below. Certain areas in the data center, such as area 406 are excluded from the calculations for example since area 406 is separated from the plenum. The domain boundary 408 defines the physical dimensions of the entire plenum.

As described above, with a domain defined by the sub-floor plenum the ACUs can be the air flow sources while the perforated tiles can be the air flow sinks applied as Neumann boundary conditions. In this particular embodiment, the right hand side of Equation 1 is set to zero. As highlighted above, air flow measurement data for the ACUs and the perforated tiles can be obtained using MMT. Suitable techniques to obtain the required input data for both the ACUs and perforated tiles are also described, for example, in H. F. Hamann, et al., "Methods and Techniques for Measuring and Improving Data Center Best Practices" IEEE Proceedings of the ITherm 2008 Conference, Orlando, Fla., pp. 1146-1152 (May 2008), the contents of which are incorporated by reference herein.

Figure 5:
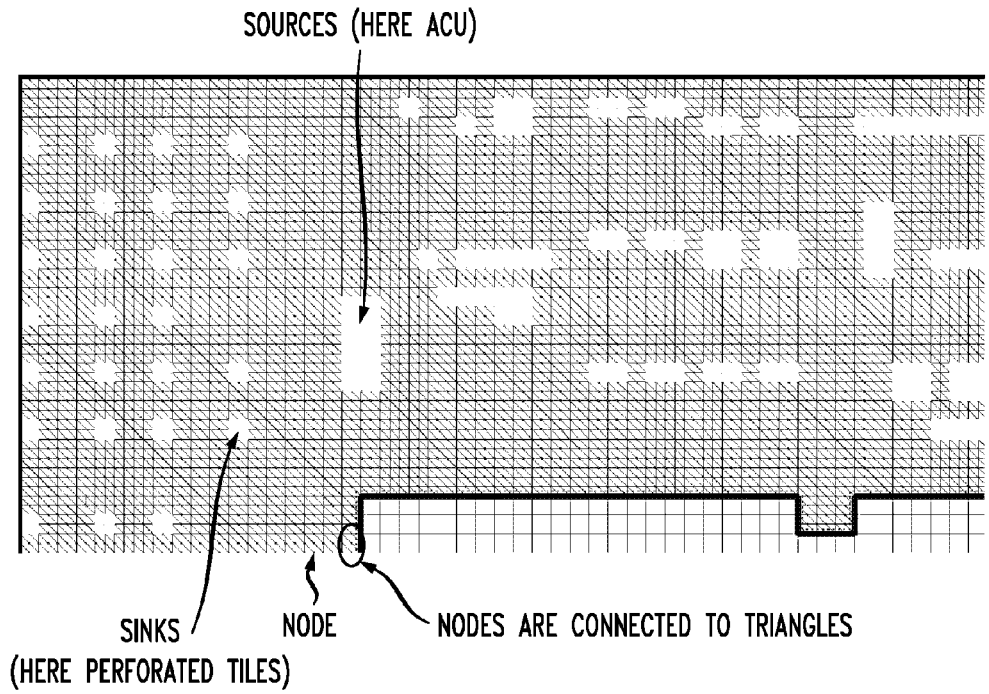
FIG. 5 is a diagram illustrating an enlarged view of a portion of the graphical representation of FIG. 4 showing a mesh according to an embodiment of the present invention.

An enlarged view of a portion 500 of graphical representation 400 shown in FIG. 5 illustrates that a mesh has been created. The nodes are connected in this two-dimensional model with triangles. The sources (e.g., ACUs) and sinks (e.g., perforated tiles) are shown labeled in FIG. 5.

Figure 6:
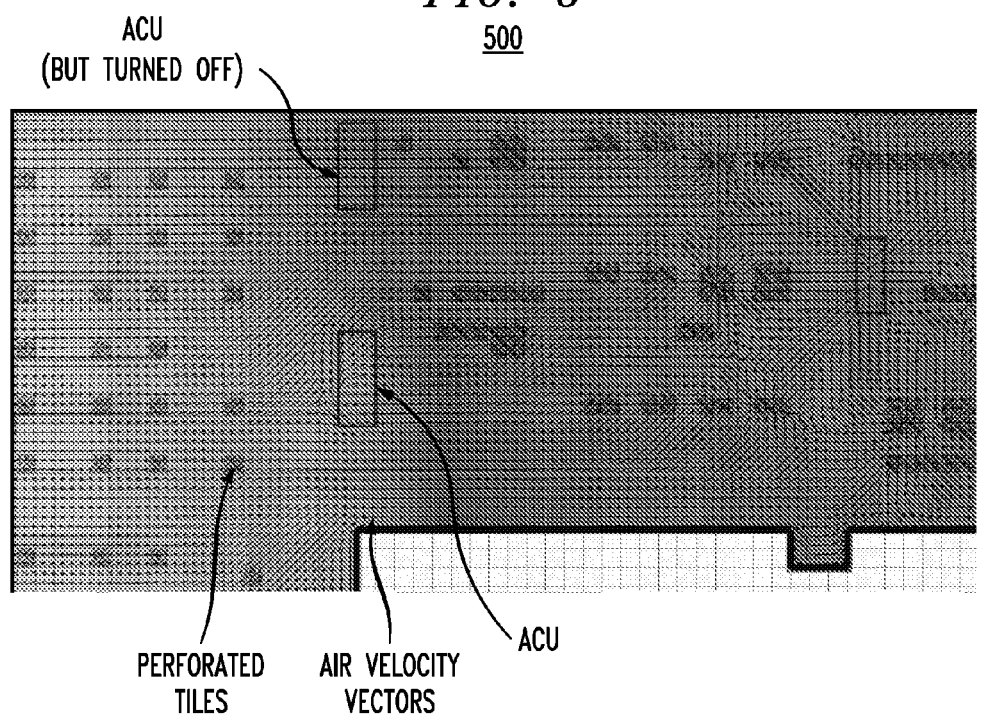
FIG. 6 is a diagram illustrating an enlarged view of the portion of the graphical representation of FIG. 4 showing air flow potential and air flow velocity vectors according to an embodiment of the present invention.

FIG. 6 is a diagram illustrating air flow potential $\phi$ as well as the corresponding air flow velocity vectors that result from performing the above-described calculations. The same portion 500 of graphical representation 400 is shown in FIG. 6. The darker areas correspond to a high air flow potential while the lighter shaded areas correspond to a lower air flow potential. As shown in FIG. 6, some of the ACUs have been turned off and thus no boundaries were applied. The underlying grid indicates the tile grid, which is typically used in data centers.

Once the air flow velocity field has been calculated (according to Equation 2, above), the air flow from/to each area of the data center is traced back to the originating/returning ACU (the air flow velocity vectors collectively indicate air flow patterns, which is why the velocity field is used to define the thermal zones (which are given by these air flow patterns)). An exemplary methodology for tracing the air flow in a data center is described, for example, in conjunction with the description of FIG. 12 below. In this particular example, the air flow is traced throughout the sub-floor plenum, but could also be done in the same manner for the raised floor as well. The trace connects a specific ACU with its corresponding thermal zone.

Figure 7:
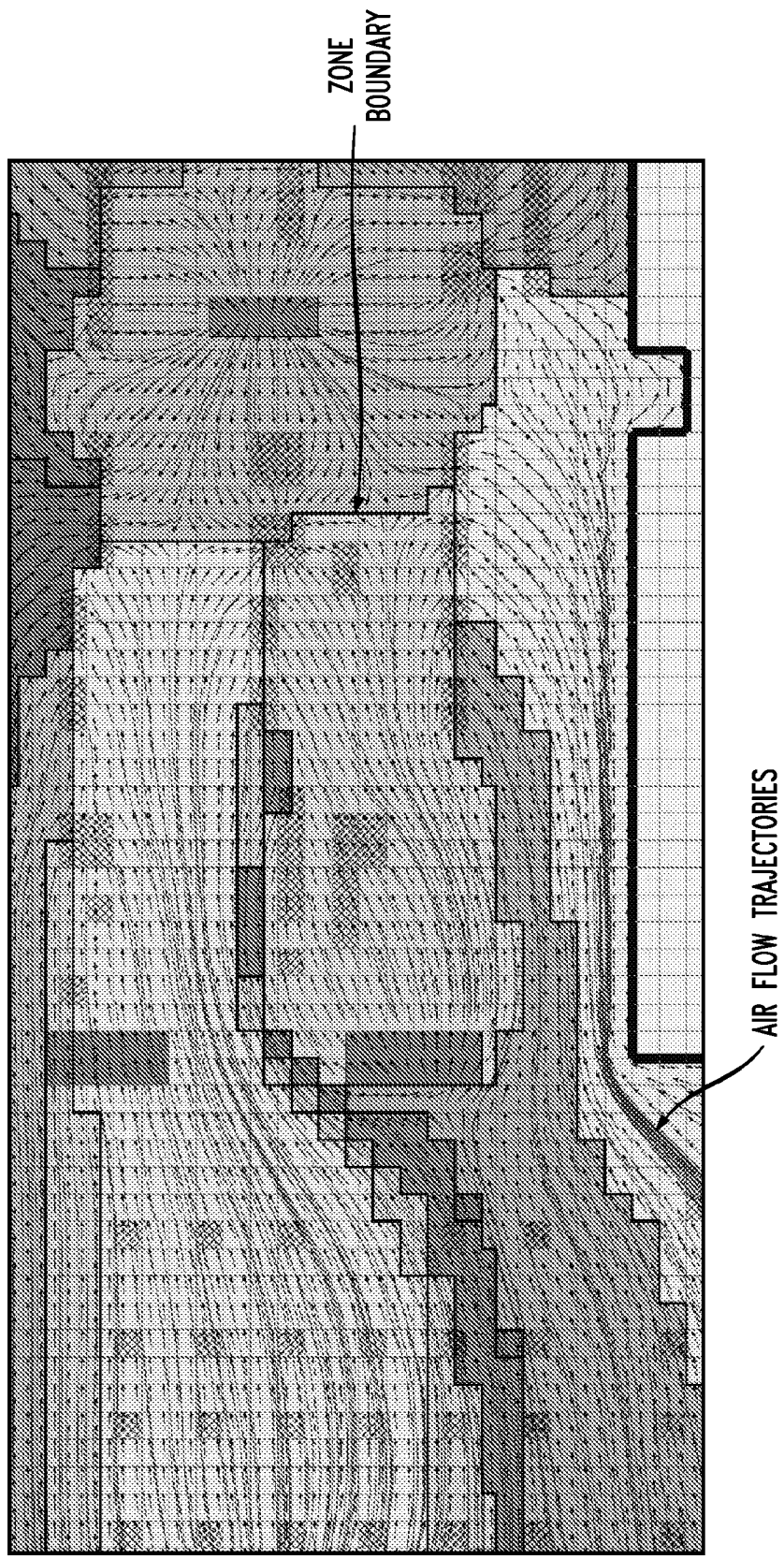
FIG. 7 is a diagram illustrating an enlarged view of the portion of the graphical representation of FIG. 4 showing traces and corresponding thermal zones according to an embodiment of the present invention.

These traces (also referred to herein as "air flow trajectories"), which are paths that individual particles follow, as well as the corresponding thermal zones, are shown in FIG. 7. Again, the same portion 500 of graphical representation 400 is shown in FIG. 7. In FIG. 7, the thermal zones are outlined (by a zone boundary). Those ACUs with a hatched pattern are turned off. In case the conditions are changing, for example, a perforated tile gets removed or different tile types are deployed or an ACU gets turned off, the calculations can be repeated and the data center plenum re-zoned accordingly. Different types of tiles have different levels of perforation which is how one can control how much air flow can be pushed through the tile for a given pressure gradient. Commonly, reference is made to the "level" of openings in the tile. So, for example, there are 25% open tiles up to 50% open tiles. A 25% open tile has a higher resistance than the 50% open tile. The resistance or impedance R is a property of the tile openness and some other factors. If the pressure differential p is known then the air flow f can be calculated by:

$$p = R \times f^2$$

At this point it is worth noting that, as long as such changes do not involve modifications to the finite element mesh, repeating the calculations will require less computing time since the nodes and elements do not have to be regenerated each time. Furthermore, if a direct solver for linear systems is used to solve Equations 4, savings in computation time are also possible as long as the matrix A in Equations 4 remains unchanged (which is the case if the conditions changing correspond only to modifications in the measured flow at the sources and sinks, as this results only in a modified right-hand side b in Equations 4). As a direct solver typically employs two phases, numerical factorization of the coefficient matrix followed by the solution of the system with the factored matrix, the numerical factorization of the coefficient matrix need only be done once, as long as the matrix remains unchanged. The numerical factorization is the most time consuming of the two phases, so doing the factorization only when strictly needed can result in considerable savings in computational time.

The present techniques may include the exploitation of the superposition principle, which may provide ways to faster solve the respective air flow patterns for varying conditions by avoiding redundant calculations. Specifically, Equation 1 being solved for the potential φ can be re-written as $\nabla \cdot (\nabla \phi) = f$, where $\nabla \cdot$ is the divergence operator. One can use the principle of superposition and sum two solutions $\phi_1$ and $\phi_2$ of Equation 1 (or, generally, any number of solutions) to obtain a third solution $\phi_3 = \phi_1 + \phi_2$ as long as $\phi_1$ and $\phi_2$ are solutions to Equation 1 for the same domain (geometry). That is, say $\phi_1$ solves $\nabla \cdot (\nabla \phi_1) = f_1$ and $\phi_2$ solves $\nabla \cdot (\nabla \phi_2) = f_2$, then $\phi_3 = \phi_2 + \phi_2$ solves $\nabla \cdot (\nabla \phi_3) = f_1 + f_2$. For example, say $\phi_1$ is a solution obtained with only ACU1 on (at a given fan speed setting), while all the other ACUs were off, and $\phi_2$ is a solution obtained with only ACU2 on (at a given fan speed setting), while all the other ACUs were off. The velocity field for the scenario with only ACU1 on is $v_1 = \nabla \phi_1$ and the velocity field for the scenario with only ACU2 on is $v_2 = \nabla \phi_2$. Then $v_3 = v_1 + v_2$ corresponds to a velocity field for the scenario with ACU1 and ACU2 on (at the corresponding fan speeds for which the original scenarios were obtained), while all other ACUs are off.

In one exemplary embodiment a graphical software (e.g., MMT client) is used to provide a graphical representation of the space, e.g., data center, define the domains, edit sinks and sources, feed sensor data (if available) to define sinks and sources, initialize the calculations, postprocess and visualize the thermal zones. MMT client is a software application, which allows graphically displaying the data center layout and also visualizing the air flow trajectories, the zones and the air flow vectors.

Figure 8:
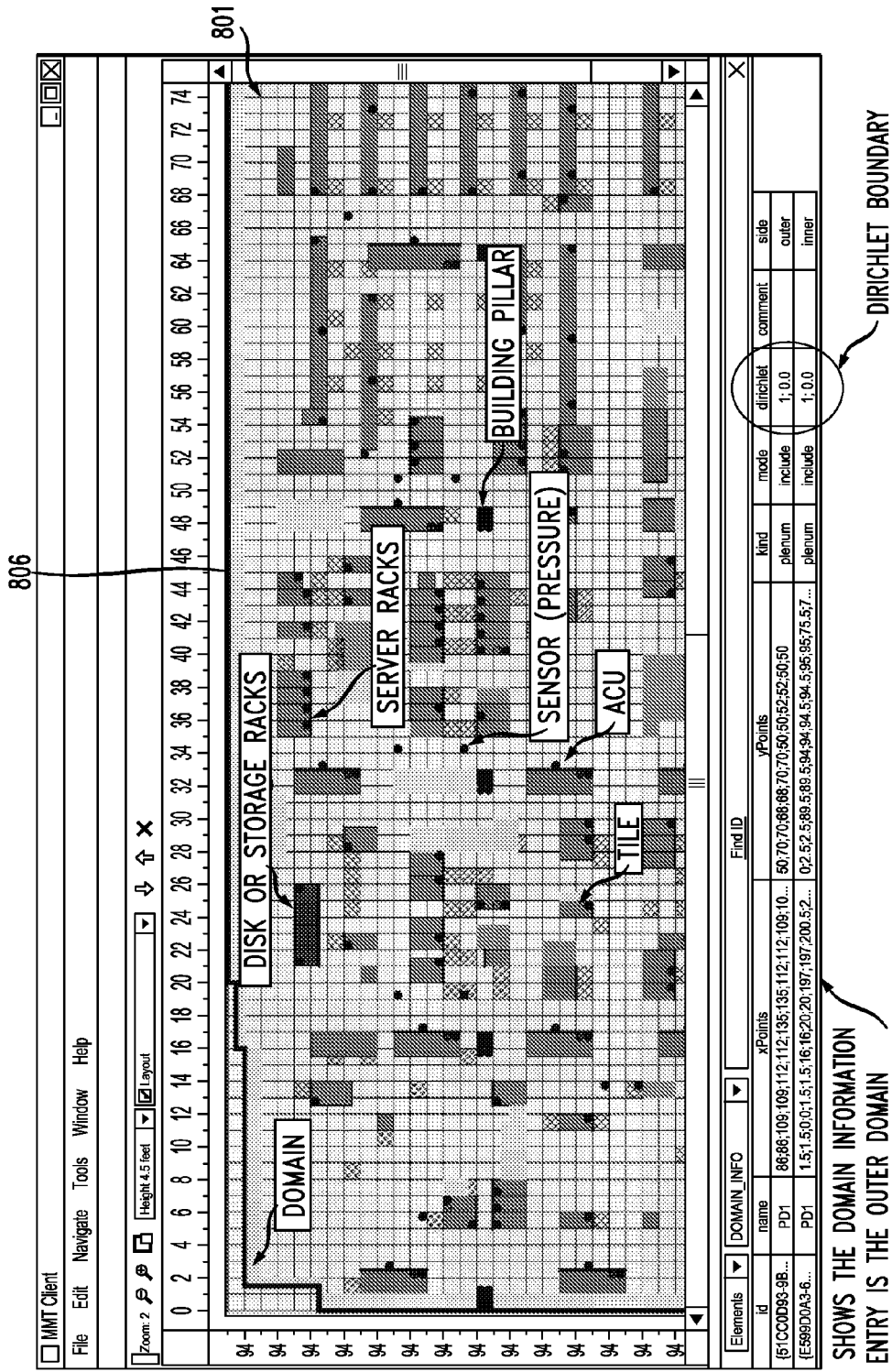
FIG. 8 is a diagram illustrating an exemplary graphical interface containing a representation of a data center according to an embodiment of the present invention.

See, for example, FIG. 8 which is a diagram illustrating exemplary graphical interface 800 (as displayed for example on a video display, such as a computer monitor, see below) containing a graphical representation 801 of a data center. For illustrative purposes, the structures within the data center, such as server racks and perforated tiles, are labeled in graphical representation 801 (and may or may not be labeled in an actual implementation of the process). The domain of the plenum is defined, for example by boundary 806, as a polygon of x- and y-points. Here two domains have been defined, an outer and an inner (the inner domain is not visible in this depiction). The outer domain circumferences the plenum of the data center while the inner covers a control room which is separate. Dirichlet boundary conditions have also been defined (where the potential is set to a certain value—in most cases zero).

Figure 9:
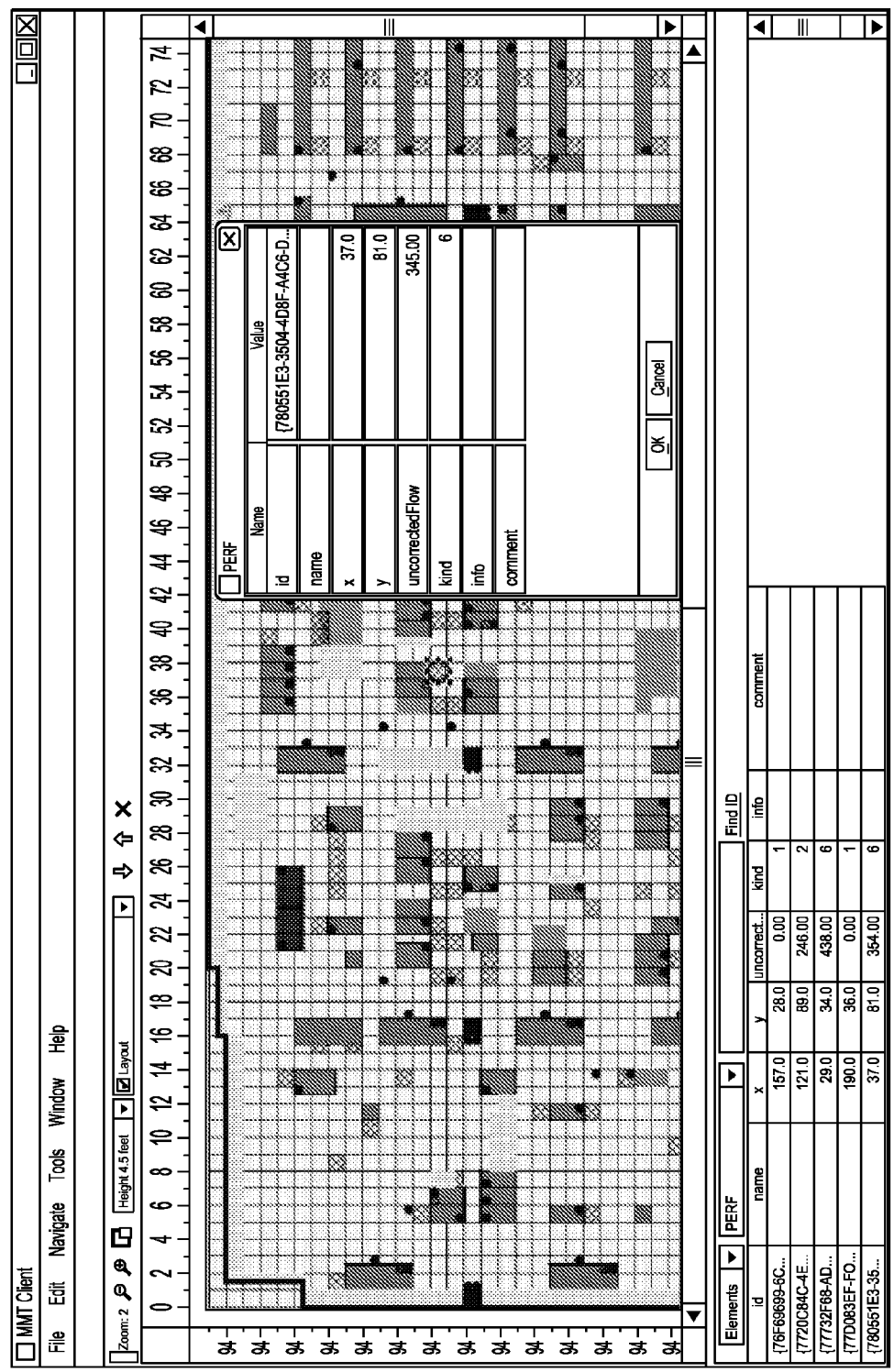
FIG. 9 is a diagram illustrating how the graphical interface of FIG. 8 can be edited to reflect changes in the data center according to an embodiment of the present invention.

As highlighted above, the air flow at one or more of the sources/sinks can change. Further, sources/sinks can be added to and/or removed from the domain. FIG. 9 is a diagram illustrating how interface 800 (of FIG. 8) can be graphically edited to reflect such changes in the domain. In this particular example the air flow is specified for a perforated tile. The perforated tile can be interactively moved, duplicated and tile properties can be readily manipulated (type, air flow impedance etc.). In one exemplary embodiment, real-time sensors located for example in the plenum can be used to update the model input. Specifically, by measuring the pressure in the plenum and in combination with air flow impedance of the vent or the perforated tile, the air flow can be automatically calculated and then applied to the zoning model. The perforated air flow tile impedance R [Pa/cfm$^2$] is given by the following equation, $$R = \frac{1}{2} \cdot \frac{\rho}{A^2} \cdot K$$

with ρ as the density of air, A as the area of the tile and K as a loss coefficient. The pressure difference the air flow are related as follows, $$\Delta p = R \cdot f^2_{airflow}.$$

The pressure differential is re-measured with real-time sensors and use $\Delta p = R \cdot f^2_{airflow}$ to calculate air flow through each tile. As discussed the air flow is applied as a boundary.

Figure 10:
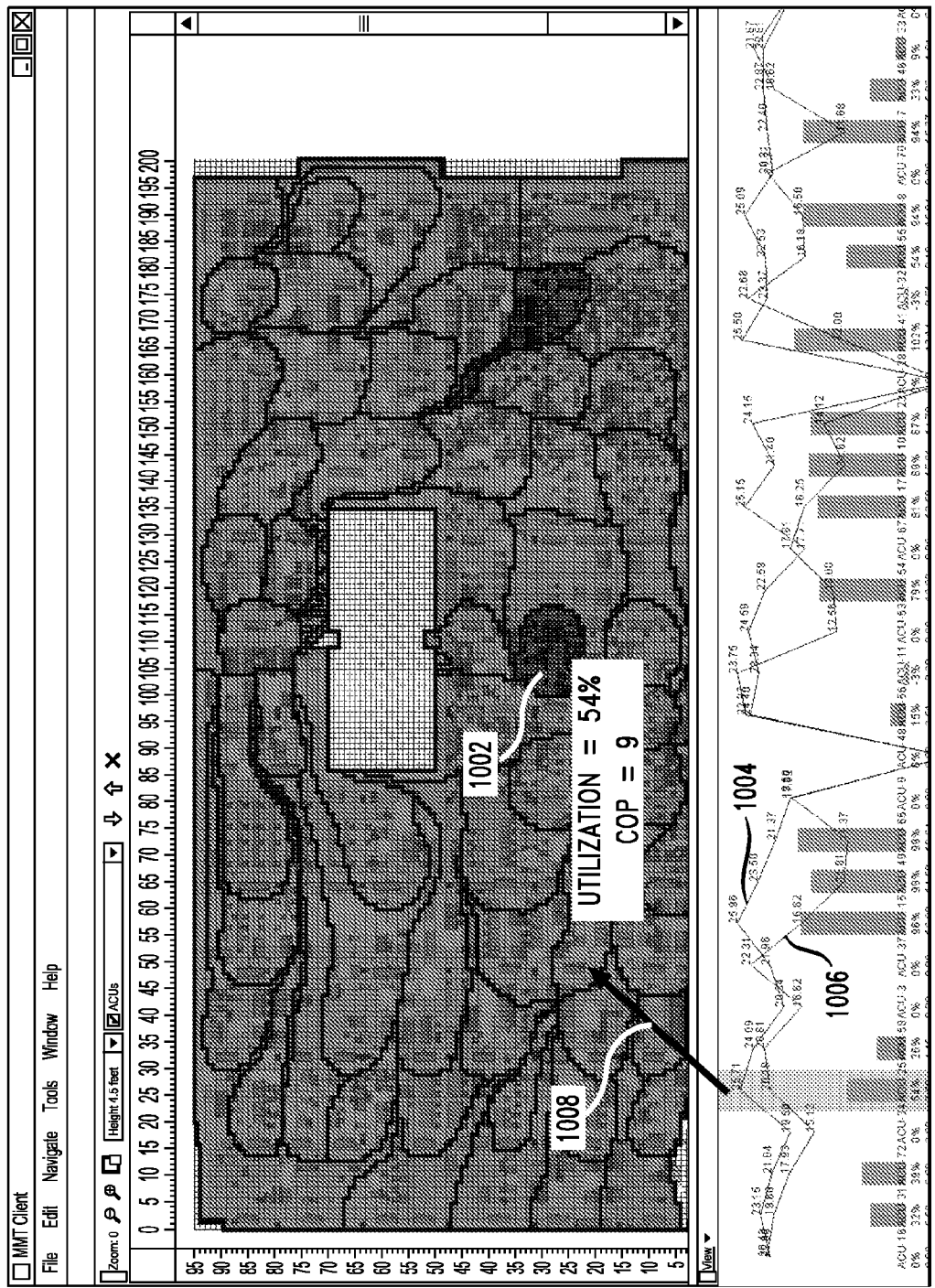
FIG. 10 is a diagram illustrating the visualization of thermal zones on the graphical interface of FIG. 8 according to an embodiment of the present invention.

Once the model has been defined and set up (i.e., a graphical representation has been provided, all domains have been defined, etc.) the thermal zones can be modeled (as described above) either based on user input or triggered by measured change in the data center using a sensor network (which, for example, can detect air flow changes and/or the addition/removal of sources/sinks from the domain, see above). FIG. 10 is a diagram illustrating the visualization of thermal zones on interface 800 (of FIG. 8). In the exemplary embodiment shown in FIG. 10, gray shading is used to differentiate the energy efficiency of the various thermal zones, with the shading used for example in thermal zone 1002 denoting the greatest efficiency. As highlighted above, efficiency can be characterized by "Utilization" or better by "COP." If one increases "heat removed" at a given nominator COP and utilization increases and thus efficiency increases (i.e., utilization (UT)=heat removed/nominal heat load removal capacity) or coefficient of performance (COP) (COP=heat removed/power consumption for ACU fans). Bar charts now present at the bottom of interface 800 illustrate the utilization and COP. Lines 1004 and 1006 above the bar charts correspond to discharge and return temperatures of the ACUs, respectively, which can be obtained either from static data (which can be edited in MMT client) or from real-time data (being fed into the MMT client from real-time sensors, e.g., so as to update conditions in the data center as described above). For illustrative purposes one of the thermal zones (having a utilization of 54% and a COP of nine) is shown linked by arrow 1008 to the corresponding bar chart.

Finally, it is notable that the present techniques can also be used to determine a respective cooling capacity from each vent or perforated tile. Namely, in conjunction with a temperature model (as described in Hamann) the vent or perforated tile discharge temperatures $T_D$ can be calculated (i.e., once a velocity field $\vec{v} = (v_x, v_y, v_z)$ is obtained, it is used in the energy equation $\rho c_p \vec{v} \mathrm{grad}(T) + \mathrm{div}\,(kg\,\mathrm{rad}(T)) = 0$ with the temperature prescribed as the boundaries (e.g., at the inlet and outlet of the servers) in order to solve for the temperature distribution). Thus, the temperature distribution can be calculated (for example in two-dimensions) as a function of an x and y coordinate $T(x,y)$. By knowing where (xt,yt) the perforated tiles are one can get the tile discharge temperature $Td = T(xt,yt)$.

Figure 11:
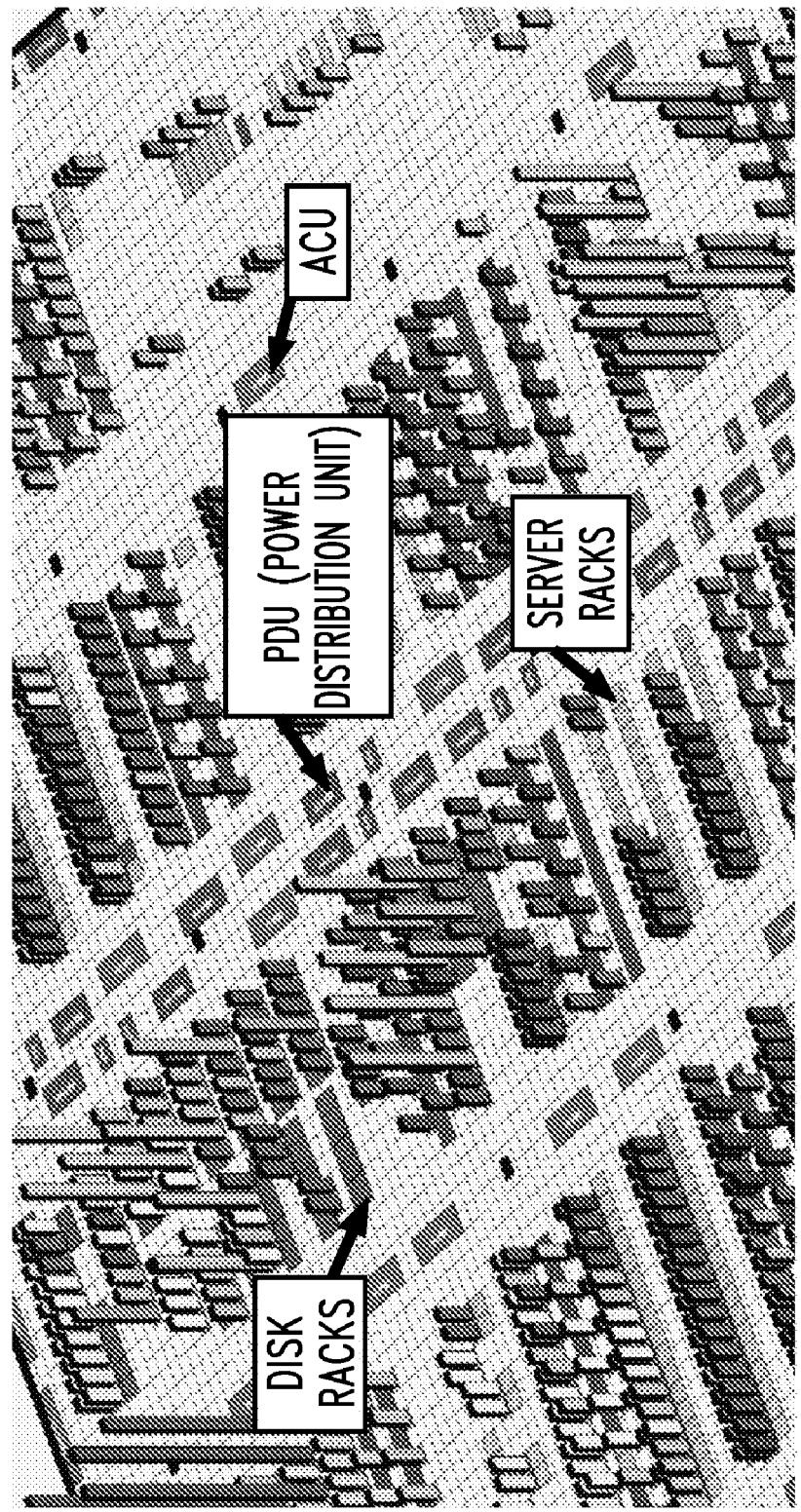
FIG. 11 is a schematic diagram illustrating cooling capacity in a data center according to an embodiment of the present invention.

In combination with the air flow velocity or total air flow and an allowable inlet temperature $T_{inlet}$ for the server, the cooling power per tile can be determined for each vent/perforated tile by $P_{cool} \approx (T_{inlet} - T_D) \cdot \mathrm{flow}/3140\,[\mathrm{cfmK/kW}]$. In case the velocity vectors have been calculated (rather than measured and used as a boundary as in this embodiment), the flow can be obtained by integrating the perpendicular velocity vector component (most often $v_z$) over the area of the tile or vent flow=$\int v_\perp dA$. An example, of this feature is shown in FIG. 11. Specifically, FIG. 11 is a schematic diagram 1100 illustrating cooling capacity in a data center. In FIG. 11, the layout representation has been overlayed as a pseudo three-dimensional image with a three-dimensional bar chart, wherein the height of the bars shows the cooling capacity (i.e., cooling power).

Figure 12:
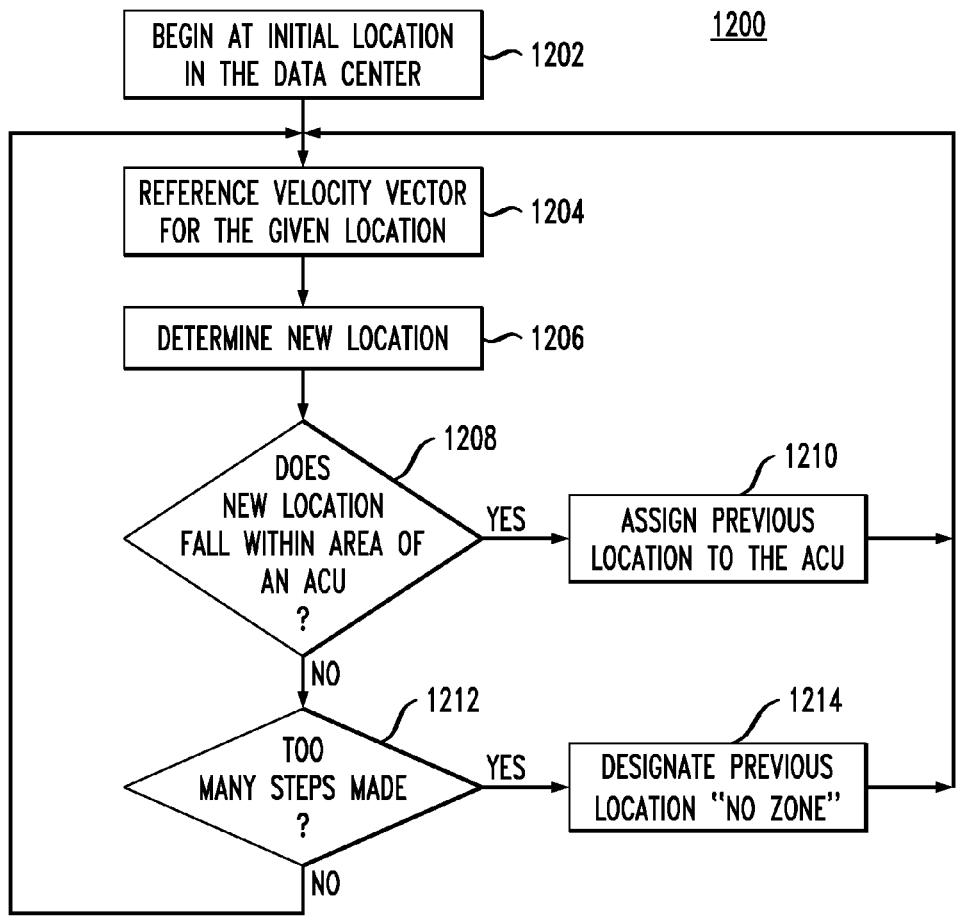
FIG. 12 is a diagram illustrating an exemplary methodology for tracing air flow velocity vectors to an air flow source according to an embodiment of the present invention.

FIG. 12 is a diagram illustrating exemplary methodology 1200 for tracing air flow velocity vectors to an air flow source, such as an ACU. Methodology 1200 represents an exemplary process for performing step 214 of methodology 200 (of FIG. 2) described above. In step 1202, the process begins at a given location (which is also considered an initial location if this is the first iteration of the process), thus a given (e.g., an initial) location is selected. According to an exemplary embodiment, when the space being modeled is a data center, each location described in accordance with this process can correspond to the location of a given tile (any tile, not just a perforated tile) in the data center raised floor. In that instance, the initial location can be any tile. The process can begin with that initial tile (location) and then loop through all tiles in the data center. In step 1204, the velocity vector for the given location (which is the initial location in the first iteration of the process) is referenced (i.e., the velocity vectors throughout the data center have already been determined, see for example step 212 of methodology 200, described above). As described above, the air flow velocity vectors throughout a space, i.e., data center, can be determined using finite element techniques (i.e., within a plurality of sub-domains) based on air flow data obtained from sources/sinks. If, however, the velocity vector for the given location has not already been determined, it can be extracted using standard interpolation techniques. For example, when calculating the trajectory a location is eventually reached that does not have a specifically calculated air flow vector. But of course there are locations close by that have a calculated air flow vector. Several different approaches have been tested for such a scenario. One approach is to use the closest velocity vector. Another approach is to use a distance weighted average of a plurality (e.g., of nine) neighboring velocity vectors. In general, however, any interpolation technique can be used.

In step 1206, a new next location is determined, i.e., calculated. Using the above example of a data center tile as a location point, in this step the next tile is selected. In a two-dimensional domain, the next location xt and yt can be selected as follows:

$$xt(\mathrm{steps}) = (xt(\mathrm{steps}-1) + vx \ast \mathrm{stepsize} \ast n);$$

and $$yt(\mathrm{steps}) = (yt(\mathrm{steps}-1) + vy \ast \mathrm{stepsize} \ast n),$$

wherein the magnitude of the velocity vector $v = \mathrm{sqrt}(vx^2 + vy^2)$ and $n = 0.2/v$. $v = \mathrm{sqrt}(vx^2 + vy^2) \ldots n = 0.2/v$ is a parameter which controls the stepsize in relationship to vx and vy and prevents making too small of a step if the velocity vectors are small. In other words, the variable n is introduced to make sure that, if velocities are very small, one still moves a sizeable step from one location to the next so that the methodology is not too slow. Stepsize can be chosen by the user.

In step 1208, a determination is made as to whether the new location falls within an area of an airflow source, e.g., an ACU. If the trajectory intersects with an ACU, then in step 1210, the previous location is assigned to that ACU. For example, if tile 1 is the initial (previous) location and tile 2 is the new location, and tile 2 falls within an area of ACU 1, then tile 1 would be assigned to ACU 1. The process is then repeated (for n number of locations, e.g., tiles, throughout the space, e.g., data center) by referencing the velocity vector for the new location, e.g., tile 2, (step 1204), determining another new location, e.g., of a tile 3, (step 1206) and so on. The ACU location is known for example from the graphical representation in the MMT client. That representation includes the x,y coordinates of the ACU as well as the width, length and height (i.e., defining the area) of the ACU. Once xt and yt (see step 1206) are within ACU area, another new location is determined, and so on.

On the other hand, if the new location (e.g., tile 2 using the above example) does not fall within an area of an ACU, then a determination can be made in step 1212 as to whether or not too many steps have been made, i.e., there is a maximum number of steps in case the trajectory does not end up at an ACU. Another way to look at it is there may be a limit imposed on the number of times steps 1204 and 1206 can be repeated without having a location (e.g., tile) fall within the area of an air flow source. If in fact too many steps have been made (i.e., the limit has been reached), then in step 1214, the previous location, e.g., tile 1, is designated as a "no zone," meaning that location is not associated with a thermal zone. The process is then repeated by referencing the velocity vector for the new location, e.g., tile 2, (step 1204), determining another new location, e.g., of a tile 3, (step 1206) and so on for n locations throughout the space. On the other hand, if the maximum number of steps has not been exceeded (i.e., the limit has not been reached) (and the new location, e.g., tile 2, does not fall within the area of an ACU (step 1208)) then the process beginning again at step 1204 is repeated, i.e., by referencing the velocity vector for the new location, e.g., tile 2, (step 1204), determining another new location, e.g., of a tile 3, (step 1206) and so on. Methodology 1200 is repeated for each of n locations, i.e., tiles, in the space, i.e., data center. In this manner, each velocity vector is traced to a particular air flow source (e.g., ACU) or designated as not being associated with a particular thermal zone. Exemplary code for tracing velocity vectors to a particular air flow source and thereby defining thermals zones in a space is provided in the computer program listing appendix.

Figure 13:
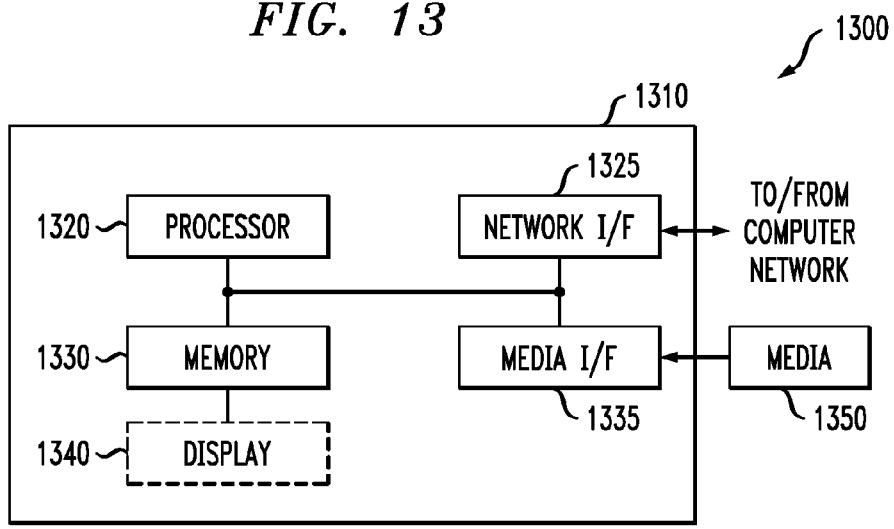
FIG. 13 is a diagram illustrating an exemplary apparatus for modeling thermal zones in a space according to an embodiment of the present invention.

Turning now to FIG. 13, a block diagram is shown of an apparatus 1300 for modeling thermal zones in a space, e.g., within a room, such as data center 100 (FIG. 1), in accordance with one embodiment of the present invention. It should be understood that apparatus 1300 represents one embodiment for implementing methodology 200 of FIG. 2.

Apparatus 1300 comprises a computer system 1310 and removable media 1350. Computer system 1310 comprises a processor device 1320, a network interface 1325, a memory 1330, a media interface 1335 and an optional display 1340 (for displaying, e.g., graphical interface 800 of FIG. 8, described above). Network interface 1325 allows computer system 1310 to connect to a network, while media interface 1335 allows computer system 1310 to interact with media, such as a hard drive or removable media 1350.

As is known in the art, the methods and apparatus discussed herein may be distributed as an article of manufacture that itself comprises a machine-readable medium containing one or more programs which when executed implement embodiments of the present invention. For instance, the machine-readable medium may contain a program configured to provide a graphical representation of the space; define at least one domain in the space for modeling; create a mesh in the domain by sub-dividing the domain into a set of discrete sub-domains that interconnect a plurality of nodes; identify air flow sources and sinks in the domain; obtain air flow measurements from one or more of the air flow sources and sinks; determine an air flow velocity vector at a center of each sub-domain using the air flow measurement obtained from the air flow sources and sinks; and trace each velocity vector to one of the air flow sources, wherein a combination of the traces to a given one of the air flow sources represents a thermal zone in the space.

The machine-readable medium may be a recordable medium (e.g., floppy disks, hard drive, optical disks such as removable media 1350, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1320 can be configured to implement the methods, steps, and functions disclosed herein. The memory 1330 could be distributed or local and the processor 1320 could be distributed or singular. The memory 1330 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1320. With this definition, information on a network, accessible through network interface 1325, is still within memory 1330 because the processor device 1320 can retrieve the information from the network. It should be noted that each distributed processor that makes up processor device 1320 generally contains its own addressable memory space. It should also be noted that some or all of computer system 1310 can be incorporated into an application-specific or general-use integrated circuit.

Optional video display 1340 is any type of video display suitable for interacting with a human user of apparatus 1300. Generally, video display 1340 is a computer monitor or other similar video display.

The example code contained in the computer program listing appendix is in a pv-wave programming language for tracing velocity vectors to a particular air flow source and thereby defining thermals zones in a space.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A computer-implemented method for modeling thermal zones in a space, comprising the steps of:
   providing, using a computer, a graphical representation of the space;
   defining, using the computer, at least one domain in the space for modeling;
   creating, using the computer, a mesh in the domain by sub-dividing the domain into a set of discrete sub-domains that interconnect a plurality of nodes;
   identifying air flow sources and sinks in the domain;
   obtaining air flow measurements from one or more of the air flow sources and sinks;
   determining, using the computer, an air flow velocity vector at a center of each sub-domain using the air flow measurement obtained from the air flow sources and sinks; and
   tracing, using the computer, each velocity vector to one of the air flow sources, wherein a combination of the traces to a given one of the air flow sources represents a thermal zone in the space.

2. The method of claim 1, wherein the space comprises a room.

3. The method of claim 2, wherein the room comprises a data center having computer equipment racks and a raised-floor cooling system with one or more computer air conditioning units configured to take in hot air from the computer equipment racks and to exhaust cooled air into a sub-floor plenum that is delivered to the computer equipment racks through a plurality of perforated tiles in the raised floor.

4. The method of claim 3, wherein the domain is defined by the dimensions of the sub-floor plenum.

5. The method of claim 4, wherein the perforated tiles comprise air flow sinks and the air conditioning units comprise air flow sources.

6. The method of claim 5, further comprising the step of:
   tracing each of the velocity vectors to one of the air conditioning units, wherein a combination of the traces to a given one of the air conditioning units represents a thermal zone in the space.

7. The method of claim 1, wherein the air flow measurements from the air flow sources and sinks are obtained using mobile measurement technology.

8. The method of claim 1, further comprising the steps of:
   repeating the identifying, obtaining, determining and tracing steps in response to a change in air flow at one or more of the air flow sources and sinks in the domain.

9. The method of claim 1, further comprising the step of:
   repeating the identifying, obtaining, determining and tracing steps in response to one or more of the air flow sources and sinks being removed from the domain.

10. The method of claim 1, further comprising the step of:
    repeating the identifying, obtaining, determining and tracing steps in response to one or more new air flow sources and sinks being added to the domain.

11. The method of claim 1, further comprising the step of: determining a cooling capacity for each air flow source.

12. The method of claim 1, further comprising the step of:

periodically repeating the obtaining, determining and tracing steps to update the air flow measurements from the air flow sources and sinks.

13. The method of claim 1, wherein the tracing step further comprises the steps of:
selecting a given location in the space;
referencing the air flow velocity vector determined at the center of the sub-domain at the location;
determining a next location in the space;
repeating the steps of referencing the air flow velocity vector and determining a next location for n number of locations throughout the space, each time assigning the given location to a given air flow source when the next location falls within an area of that given air flow source.

14. The method of claim 13, further comprising the step of:
placing a limit on the number of times the repeating step is performed without having a location fall within the area of a given air flow source.

15. The method of claim 14, further comprising the step of:
determining whether the repeating step has been performed too many times, whenever the next location does not fall within the area of an air flow source.

16. The method of claim 14, further comprising the step of:
designating the given location as not being associated with a thermal zone whenever the limit is reached.

17. An article of manufacture for modeling thermal zones in a space, comprising a machine-readable recordable medium containing one or more programs which when executed implement the steps of the method according to claim 1.

18. An apparatus for modeling thermal zones in a space, the apparatus comprising:
a memory; and
at least one processor device, coupled to the memory, operative to:
provide a graphical representation of the space;
define at least one domain in the space for modeling;
create a mesh in the domain by sub-dividing the domain into a set of discrete sub-domains that interconnect a plurality of nodes;
identify air flow sources and sinks in the domain;
obtain air flow measurements from one or more of the air flow sources and sinks;
determine an air flow velocity vector at a center of each sub-domain using the air flow measurement obtained from the air flow sources and sinks; and
trace each velocity vector to one of the air flow sources, wherein a combination of the traces to a given one of the air flow sources represents a thermal zone in the space.

* * * * *